United States Patent
Pavio et al.

[11] Patent Number: 5,773,887
[45] Date of Patent: Jun. 30, 1998

[54] HIGH FREQUENCY SEMICONDUCTOR COMPONENT

[75] Inventors: Anthony M. Pavio, Paradise Valley; William M. Vassar, Apache Junction, both of Ariz.

[73] Assignee: Motorola, Inc., Schaumburg, Ill.

[21] Appl. No.: 879,453

[22] Filed: Jun. 20, 1997

Related U.S. Application Data

[63] Continuation of Ser. No. 657,247, Jun. 3, 1996, abandoned.

[51] Int. Cl.$^6$ .......................... H01L 23/34; H01L 29/80; H01L 31/112
[52] U.S. Cl. .......................... 257/728; 257/275; 257/276; 257/664; 257/774; 333/246; 333/247
[58] Field of Search ..................... 257/698, 725, 257/728, 774, 776, 275, 276, 277, 664; 333/246, 247

[56] References Cited

U.S. PATENT DOCUMENTS

| | | | |
|---|---|---|---|
| 4,766,481 | 8/1988 | Gobrecht et al. ........................ | 257/664 |
| 5,075,648 | 12/1991 | Roberts et al. .......................... | 333/128 |
| 5,138,436 | 8/1992 | Koepf ........................................ | 357/74 |
| 5,206,712 | 4/1993 | Kornrumpf et al. ..................... | 361/393 |
| 5,304,805 | 4/1994 | Brown et al. .......................... | 250/338.1 |
| 5,426,319 | 6/1995 | Notani ..................................... | 257/275 |
| 5,451,818 | 9/1995 | Chan et al. .............................. | 257/728 |
| 5,455,384 | 10/1995 | Ichihara ................................. | 174/52.2 |
| 5,528,074 | 6/1996 | Goto et al. .............................. | 257/664 |
| 5,534,727 | 7/1996 | Inoue ...................................... | 257/659 |

*Primary Examiner*—Mahshid D. Saadat
*Assistant Examiner*—Allan R. Wilson
*Attorney, Agent, or Firm*—George C. Chen

[57] ABSTRACT

A high frequency semiconductor component (10) includes a first substrate (12) having a first surface (13) opposite a second surface (14), a first electrically conductive layer (16) supported by the first surface (13) of the first substrate (12), a second electrically conductive layer (17) supported by the second surface (14) of the first substrate (12) wherein the second electrically conductive layer (17) is electrically coupled to the first electrically conductive layer (16), a second substrate (19) having a first surface (20) and a second surface (21), a third electrically conductive layer (22) supported by the first surface (20) of the second substrate (19), and an electrically insulating layer (23) between the second and third electrically conductive layers (17, 22) wherein the second and third electrically conductive layers (17, 22) are electrically coupled together through the electrically insulating layer (23).

18 Claims, 2 Drawing Sheets

HIGH FREQUENCY SEMICONDUCTOR COMPONENT

This application is a of prior application Ser. No. 08/657,247, filed Jun. 3,1996,now abandoned.

BACKGROUND OF THE INVENTION

This invention relates, in general, to high frequency semiconductor devices, and more particularly, to high frequency transitions from one high frequency component to another high frequency component.

Very short wire bonds or ribbon bonds are conventionally used to electrically couple or to provide an electrical transition from one semiconductor chip to another semiconductor chip or from a semiconductor chip to an assembly substrate. However, when the semiconductor chip or chips are operated at high frequencies, the conventional coupling techniques do not provide an efficient transition to and from the semiconductor chip or chips. Due to the very small wavelengths involved during high frequency operation, the wire bonds and ribbon bonds exhibit prohibitively large inductive characteristics, which degrade the high frequency circuit performance. The conventional coupling or transitioning techniques also have high insertion losses and high voltage standing wave ratios (high VSWRs), which degrade the high frequency circuit performance even further. Additionally, the conventional wire and ribbon bonds require difficult and labor intensive assembly processes, which increase the cost of the high frequency component.

Accordingly, a need exists for an efficient high frequency transition from one component to another component. The high frequency transition should exhibit low insertion loss and a low VSWR. The high frequency transition should be able to be manufactured easily and repeatably and should be cost effective.

DETAILED DESCRIPTION OF THE DRAWINGS

Figure 1:
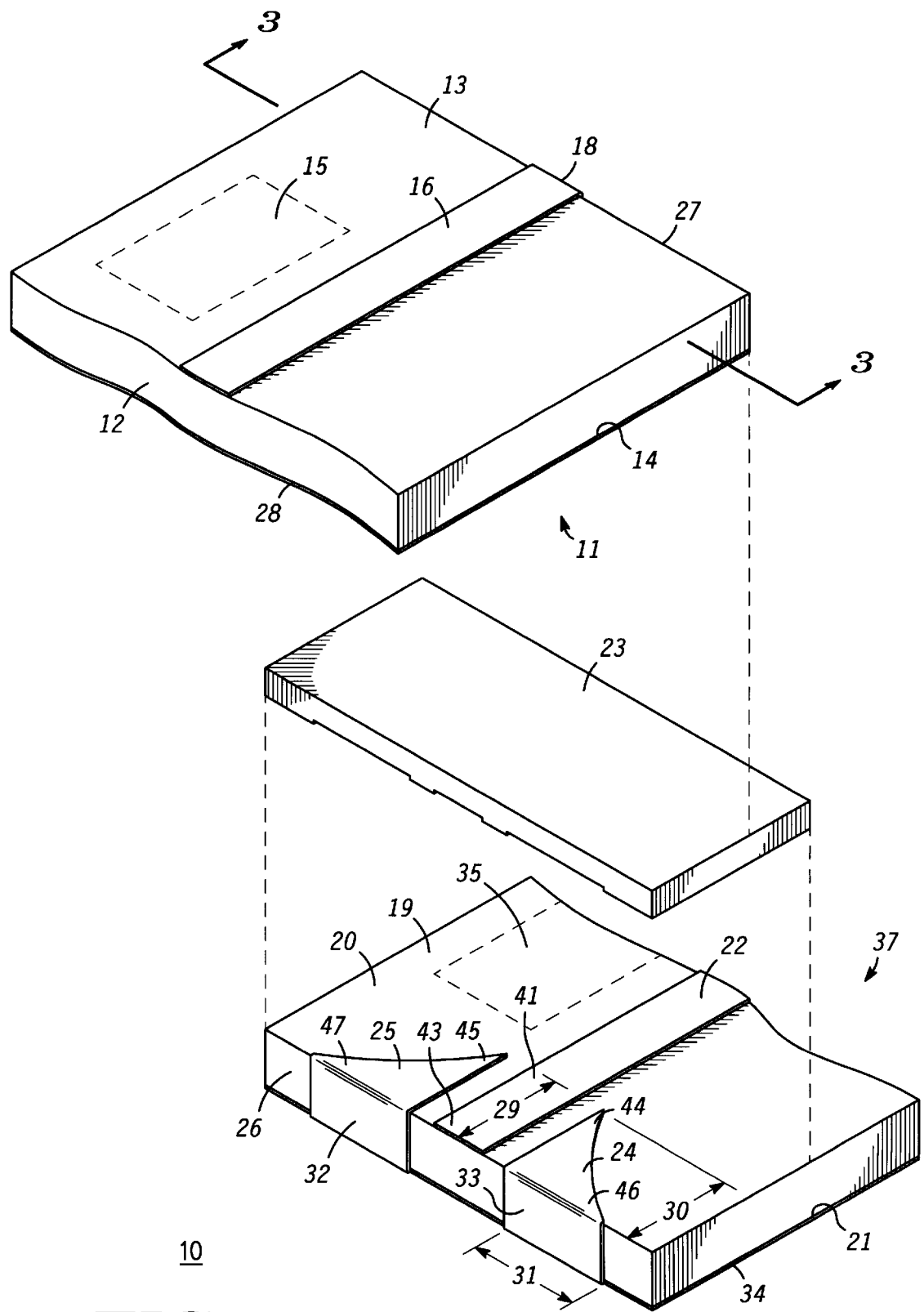
FIG. 1 illustrates an expanded partial isometric view of a high frequency semiconductor component in accordance with the present invention.
Figure 2:
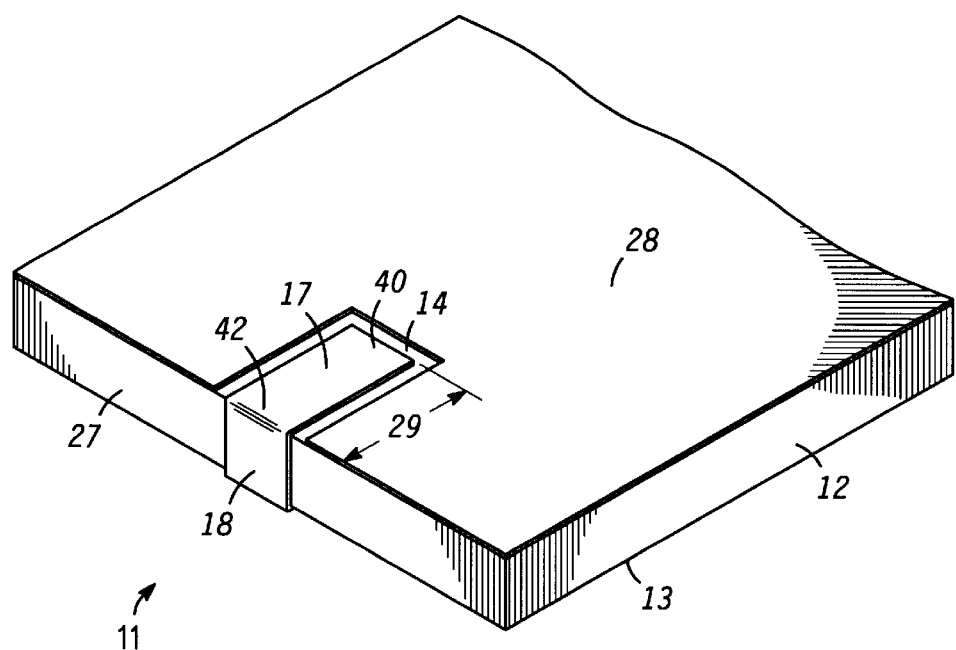
FIG. 2 portrays a partial isometric view of a portion of the high frequency semiconductor component turned upside-down and rotated approximately one hundred eighty degrees in accordance with the present invention.

FIG. 1 illustrates an expanded partial isometric view of a high frequency semiconductor component 10, and FIG. 2 portrays a partial isometric view of a portion 11 of high frequency semiconductor component 10 wherein portion 11 is turned upside-down and rotated approximately one hundred eighty degrees. It is understood that the same reference numerals are used in the figures to denote the same elements. Component 10 includes portions 11 and 37 and an electrically insulative spacer or layer 23 located between a portion of portions 11 and 37. Portion 11 includes a substrate 12 that can be comprised of a semiconductor substrate supporting dielectric and metal layers wherein the semiconductor substrate is comprised of silicon, gallium arsenide, or the like. Substrate 12 has surfaces 13 and 14, which are opposite to each other, and a side surface 27 that couples, joins, or connects surfaces 13 and 14. Substrate 12 can have a thickness of approximately ten to one hundred microns.

An optional semiconductor device 15 can be formed in surface 13 of substrate 12 using semiconductor manufacturing processes known to those skilled in the art. Because device 15 can have many different structures, the depicted structure is only for the purpose of illustrating device 15. Surface 13 can also support a plurality of semiconductor devices to form an integrated circuit. Device 15 is capable of operating at high frequencies of approximately 500 megahertz or higher in order for component 10 to be compatible with other high speed devices.

Portion 11 also includes an electrically conductive layer 16 adjacent to, supported by, or physically coupled to surface 13. Layer 16 is also adjacent to and electrically coupled to device 15. Layer 16 can be comprised of any highly electrically conductive material such as, for example, copper, aluminum, gold, silver, titanium, tungsten, or highly doped polysilicon and can be formed over a portion of surface 13 using plating, sputtering, evaporating, or other deposition techniques known in the art. The thickness and width of layer 16 should be dependent upon the desired impedance of layer 16. As an example, when an impedance of approximately thirty to seventy ohms is desired for layer 16, layer 16 can be comprised of gold and can have a thickness of approximately one to ten microns and a width of approximately twenty to eighty microns.

An optional electrically conductive layer 18 (FIGS. 1 and 2) can be coupled to side surface 27 of substrate 12. Layer 18 electrically couples layer 16 with yet another electrically conductive layer 17 (FIG. 2), which is adjacent to, supported by, or physically coupled to a portion of surface 14 of substrate 12. Layers 17 and 18 are preferably similar in composition, thickness, and width to layer 16 in order to facilitate fabrication of component 10. In the preferred embodiment, layers 16 and 17 are transmission lines or microstrips that provide efficient conduction of high frequency electrical signals from device 15 to portion 37 of component 10.

An additional electrically conductive layer 28 (FIGS. 1 and 2) is adjacent to, supported by, or physically coupled to a different portion of surface 14 of substrate 12. Layer 28 is used as a backside ground for device 15. Layer 28 is adjacent to but is physically separated from and electrically insulated from layer 17, which is also located over surface 14. Layer 28 can be coplanar to layer 17, and layer 28 can be comprised of a material such as, for example, those listed earlier for layer 16, and layer 28 can also be formed using similar techniques as those previously described for layer 16. In the preferred embodiment, layer 28 serves as a backside electrode to bias device 15 or as a backmetal electrode or ground plane for substrate 12. Layer 28 has a hole in which layer 17 is located to permit electrical coupling between layer 17 and portion 37 as explained hereinafter.

Portion 37 (FIG. 1) of component 10 includes a substrate 19 that serves as an assembly substrate for supporting substrate 12. Substrate 19 has surfaces 20 and 21 and a side surface 26 wherein surface 20 is opposite to surface 21 and wherein side surface 26 physically couples surfaces 20 and 21. Surface 20 of substrate 19 faces towards surface 14 of substrate 12. Substrate 19 can be comprised of assembly substrate materials known in the art including, but not limited to, polyester or glass cloth and epoxy, or substrate 19 can be comprised of semiconductor, dielectric, and metal materials similar to substrate 12. Substrate 19 can have a thickness of approximately ten to one hundred microns.

An optional integrated circuit 35 or a single semiconductor device can be formed in surface 20 when substrate 19 is comprised of a semiconductor material. Because circuit 35 can have many different structures, the depicted structure is only for the purpose of illustrating circuit 35. Circuit 35 is preferably capable of operating at high frequencies of approximately 500 megahertz or higher in order for component 10 to be compatible with other high speed devices.

An electrically conductive layer 22 is adjacent to, supported by, or physically coupled to a portion of surface 20 of substrate 19, and other electrically conductive layers 24 and 25 are adjacent to, supported by, or physically coupled to other portions of surface 20. Layer 22 is adjacent to and can be electrically coupled to circuit 35, but layer 22 is substantially electrically isolated from layer 28. A portion of layer 22 is located under layer 16 and located under and electrically coupled to layer 17. For alignment considerations between portions 11 and 37, a width of layer 22 is preferably smaller than or the same as the width of layer 17. Layers 24 and 25 are located adjacent to opposite sides of layer 22 and are located under and are electrically coupled to layer 28. Layers 24 and 25 are substantially electrically isolated from both of layers 17 and 22 and can be coplanar to each other and to layer 22. In the preferred embodiment, layer 22 and layers 24 and 25 are transmission lines, microstrips, or electrical waveguides for efficient conduction of high frequency electrical signals to and from layer 17 and layer 28, respectively, of portion 11 in component 10. In this preferred embodiment, layers 22, 24, and 25 form a plane that is substantially parallel to a different plane formed by layers 17 and 28 (FIG. 2).

Additional electrically conductive layers 32 and 33 are adjacent to or coupled to side surface 26 of substrate 19. Layers 32 and 33 are electrically coupled to layers 25 and 24, respectively, and are both electrically isolated from layer 22. Still another electrically conductive layer 34 is coupled to surface 21 of substrate 19. Layer 34 is electrically coupled to and electrically shorts together layers 24, 25, 32, and 33. In the preferred embodiment, layer 34 serves as a ground plane for component 10. Layers 22, 24, 25, 32, 33, and 34 can be comprised of materials and can be fabricated by processes discussed earlier for layer 16.

Electrically insulating layer 23 is located between surfaces 14 and 20 of substrates 12 and 19, respectively. Layer 23 is also located between and physically separates layers 17 and 28 from layers 22, 24, and 25. Layer 23 is preferably continuous or devoid of holes or vias over layers 25 and 24 and beneath layer 17 in order to prevent a low frequency or direct current (d.c.) conduction between layers 17 and layer 22 and between layer 28 and layers 24 and 25. Therefore, layer 23 is electrically insulating because layer 23 prevents a d.c. current from passing between portions 11 and 37 of component 10. However, portions 11 and 37 of component 10 are still electrically coupled together despite the lack of a d.c. connection between portions 11 and 37. Instead, portions 11 and 37 are electrically coupled together by a high frequency or radio frequency (r.f.) conduction path through layer 23. Specifically, layers 17 and 22 can serve as transmission lines that are electrically coupled together by a high frequency signal conducted through a portion of layer 23. Similarly, layer 28 is electrically coupled to layers 24 and 25 by another high frequency signal conducted through a different portion of layer 23, as explained in more detail hereinafter.

Layer 23 should be sufficiently thin to permit a high frequency signal to pass through. As an example, if layer 23 is comprised of a polyimide layer, then layer 23 can be approximately ten to fifty microns thick. As another example, if layer 23 is comprised of a thermal oxide grown on layers 17, 22, 24, 25, or 28, then layer 23 can be less than one thousand angstroms thick. Additional types of suitable materials for layer 23 include, but are not limited to, mylar or air. In an alternative embodiment, layer 23 is comprised of a plurality of bumps that serve as spacers between portions 11 and 37 of component 10. In this alternative embodiment, air could be used as the dielectric material between layer 17 and layer 22 and between layer 28 and layers 24 and 25.

Although layers 24 and 25 are depicted as being symmetrical in FIG. 1, layers 24 and 25 may have different shapes. Furthermore, component 10 may include a plurality of layers 24 and 25 over surface 20 to improve the high frequency performance of component 10. Moreover, layer 17 may be removed from component 10 wherein layer 16 is electrically coupled to layer 22 through substrate 12 and layer 23 by a high frequency current. In this alternative embodiment, layer 28 has a hole with a length 29 wherein the hole is over a portion of layer 22 and under a portion of layer 16.

Figure 3:
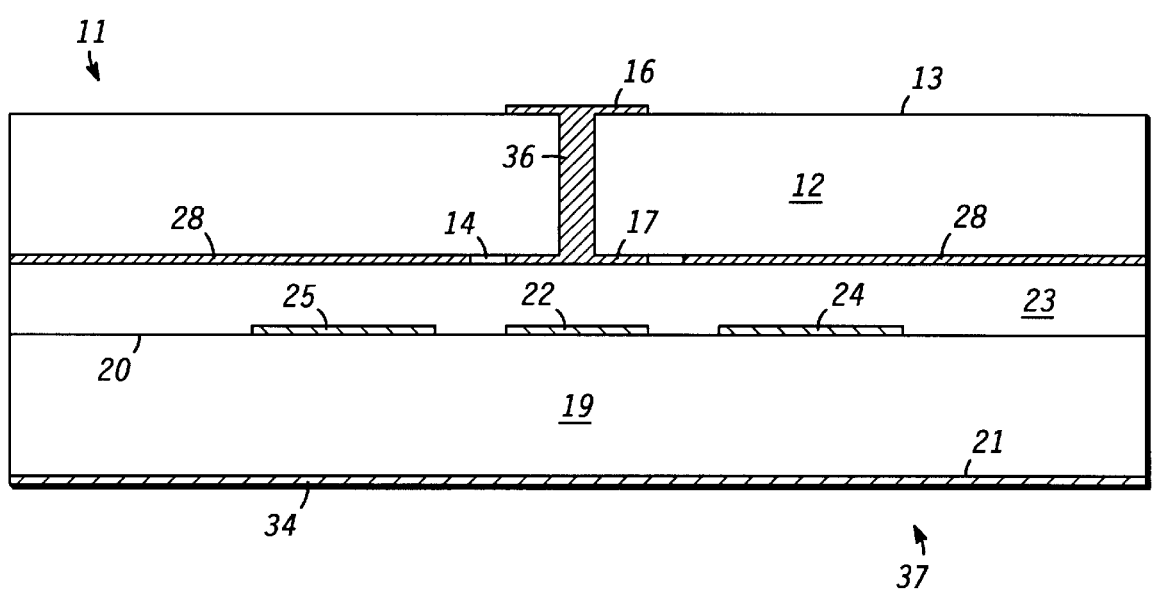
FIG. 3 depicts a cross-sectional view of the high frequency semiconductor component taken along a section line 3—3 of FIG. 1 in accordance with the present invention.

FIG. 3 depicts a cross-sectional view of component 10 taken along a section line 3—3 of FIG. 1. It is understood that the same reference numerals are used in the figures to denote the same elements. Substrate 12 has a via 36 that underlies layer 16 and that extends from surface 13 to surface 14. Thus, layer 16 is electrically coupled to layer 17 through via 36. Via 36 can be fabricated within substrate 12 using semiconductor etching processes known in the art. Via 36 can be completely filled in with an electrically conductive material as depicted in FIG. 3, or sidewalls of via 36 can be simply coated with an electrically conductive material such as that used for layer 16. Via 36 can have a diameter of approximately fifteen to seventy-five microns. Via 36 is covered by a portion of layer 16 along surface 13 and is also covered by a portion of layer 17 along surface 14. It is understood that via 36 is preferably used in place of layer 18 (FIGS. 1 and 2) to facilitate the fabrication of component 10. However, via 36 can also be used in addition to layer 18. It is also understood that substrate 12 can include a plurality of vias to further improve the electrical coupling between layer 16 and layer 17, and it is further understood that substrate 19 can also have vias to electrically couple layer 34 with layers 24 and 25.

To ensure an efficient high frequency transition between portions 11 and 37 of component 10, layer 17 has a length 29 (FIG. 2) that is preferably approximately one quarter of a wavelength of an operating frequency of device 15 or circuit 35, and layers 24 and 25 each have a length 30 and a width 31 (FIG. 1) that are preferably both approximately one quarter of a wavelength of an operating frequency of device 15 or circuit 35. The exact preferred length of layer 17 and the exact preferred lengths and widths of layers 24 and 25 are dependent upon the dielectric constant of layer 23 and the thickness of substrate 19. As an example, when device 15 is operated at approximately seventy to eighty gigahertz and when substrate 19 is approximately fifty microns thick, length 29 is preferably less than approximately five hundred microns.

With the details of component 10 provided hereinbefore, one skilled in the art of high frequency transitions will understand that a high frequency open circuit exists between layer 28 and portions 44 and 45 (FIG. 1) of layers 24 and 25, respectively, and a high frequency short circuit exists between layer 28 and portions 47 and 46 of layers 24 and 25, respectively, at a broad band of the operating frequency when layer 23 is not too thick. Furthermore, another high frequency open circuit exists between portions 40 and 41 of layers 17 and 22, respectively, and another high frequency short circuit exists between portions 42 and 43 of layers 17 and 22, respectively, at a broad band of the operating frequency when layer 23 is not too thick.

In order to provide the efficient high frequency coupling described hereinbefore, the entire length and width of each of layers 24 and 25 preferably underlie a different portion of layer 28. Furthermore, layer 17 should be aligned to layer 22 such that all of layer 17 along a first axis overlies a portion of layer 22 wherein the first axis is substantially parallel to length 29. However, the alignment of layer 17 to layer 22 along a second axis, which is substantially perpendicular to length 29 and the first axis, is not as important as the alignment along the first axis. The efficient high frequency transition is still maintained if layer 17 is misaligned along the second axis such that a portion of layer 17 extends beyond layer 22 along the second axis. However, layer 17 should not overlap either of layers 24 or 25. Therefore, the manufacturing or assembly of component 10 is facilitated by the lower alignment precision requirement.

It is understood that only one of length 30 or width 31 needs to be approximately one quarter of a wavelength of an operating frequency of device 15 or circuit 35 in order to provide the high frequency coupling between layer 28 and layers 24 and 25. However, when both length 30 and width 31 have the same preferred dimension, layers 24 and 25 each have a lower inductance, and thus, the high frequency short circuit between layer 28 and portions 47 an 46 of layers 24 and 25, respectively, is obtained for a broader band of operating frequencies. Thus, the shape of layers 24 and 25 provide a path for ground plane currents from layer 28 to be conducted to the ground plane or layer 34 of substrate 19.

In summary, layers 16, 17, and 18 can be electrically coupled by a low or high frequency signal, and layers 24, 25, 32, 33, and 34 can also be electrically coupled by a different low or high frequency signal. Layers 17 and 22 are not directly connected together and are devoid of being electrically coupled by a low frequency or d.c. signal. Similarly, layers 24 and 28 and layers 25 and 28 are devoid of a d.c. connection. Lengths 29 and 30 and width 31 are preferably approximately equal so that layers 17 and 22 can be efficiently electrically coupled together by a high frequency signal or an r.f. current through a portion of layer 23 and so that layer 28 and layers 24 and 25 can be efficiently electrically coupled together by a high frequency signal or an r.f. current through a different portion of layer 23.

Computer simulations have shown that the high frequency transition of component 10 is more efficient than the prior art. Portions 11 and 37 are well matched and only generate small amounts of reflected power. Consequently, the voltage standing wave ratio (VSWR), which is a measure of the efficiency of a high frequency transition, has been simulated at a frequency of approximately seventy to eighty gigahertz to be approximately six decibels (dB) lower than that of the prior art when the VSWR is expressed in dB. Furthermore, the insertion loss, which is another measure of the efficiency of a high frequency transition, has also been simulated to be approximately half of the insertion loss of the prior art.

Therefore, it is apparent there has been provided an improved high frequency semiconductor component that overcomes the disadvantages of the prior art. The component described herein has a more efficient high frequency transition between different substrates compared to the prior art. The present component does not suffer from the high inductance problems associated with using a d.c. connection such as, for example, wire or ribbon bonds for the high frequency transition. The high frequency transition provided by the present component exhibits lower insertion loss and lower VSWR compared to the prior art. The high frequency transition of the present component is also cost effective and is easily manufactured by automated manufacturing methods because of the reduced alignment precision requirement.

While the invention has been particularly shown and described with reference to preferred embodiments, it will be understood by those skilled in the art that changes in form and detail may be made without departing from the spirit and scope of the invention. For instance, the numerous details set forth herein, such as, for example, the specific frequencies of operation, the specific dimensions, and the specific compositions of the electrically conductive layers are provided to facilitate the understanding of the present invention and are not provided to limit the scope of the invention. As an additional example, the high frequency transition described herein may be used to electrically couple together a plurality of semiconductor chips, a plurality of assembly substrates, or any combination thereof. Accordingly, the disclosure of the present invention is not intended to be limiting. Instead, the disclosure of the present invention is intended to be illustrative of the scope of the invention, which is set forth in the following claims.

We claim:

1. A high frequency semiconductor component comprising:

a first substrate having a first surface opposite a second surface, the first substrate comprised of a semiconductor substrate, the first and second surfaces at opposites sides of the semiconductor substrate;

a first transmission line supported by the first surface of the first substrate;

an integrated circuit supported by and located at least partially within the first surface of the first substrate, the integrated circuit electrically coupled to the first transmission line;

a second transmission line supported by the second surface of the first substrate, the second transmission line electrically coupled to the first transmission line by a d.c. connection;

a second substrate having a first surface and a second surface wherein the first surface faces towards the second surface of the first substrate;

a third transmission line supported by the first surface of the second substrate and underlying the second transmission line; and an electrically insulating layer between the second and third transmission lines, the second and third transmission lines capable of being electrically coupled together by a high frequency signal through the electrically insulating layer, the second and third transmission lines devoid of a d.c. connection with each other.

2. The high frequency semiconductor component of claim 1 wherein the electrically insulating layer is continuous beneath the second transmission line.

3. The high frequency semiconductor component of claim 1 wherein the second transmission line has a length and wherein the length of the second transmission line overlies a portion of the third transmission line.

4. The high frequency semiconductor component of claim 1 further comprising:

a ground plane supported by the second surface of the first substrate, the ground plane devoid of a d.c. connection with the second transmission line, the ground plane coplanar with the second transmission line; and two additional transmission lines supported by the first surface of the second substrate, the two additional transmission lines devoid of a d.c. connection with the ground plane and the third transmission line wherein the electrically insulating layer is between the two additional transmission lines and the ground plane wherein the two additional transmission lines underlie a portion of the ground plane wherein the two additional transmission lines are capable of being electrically coupled to the ground plane by a high frequency signal through the electrically insulating layer wherein a first one of the two additional transmission lines is adjacent to a first side of the third transmission line wherein a second one of the two additional transmission lines is adjacent to a second side of the third transmission line and wherein the two additional transmission lines are coplanar with the third transmission line.

5. The high frequency semiconductor component of claim 4 wherein the second transmission line has a length and wherein each of the two additional transmission lines have a length and wherein the length of the second transmission line is approximately equal to each of the lengths of the two additional transmission lines.

6. The high frequency semiconductor component of claim 5 wherein each of the two additional transmission lines has a width and wherein the length of the second transmission line is approximately equal to each of the widths of the two additional transmission lines.

7. A semiconductor component comprising:
   a first substrate having a first surface, a second surface, and a side surface wherein the side surface couples the first and second surfaces, wherein the first substrate is comprised of a semiconductor substrate, and wherein the first and second surfaces are located at opposite sides of the semiconductor substrate;
   a semiconductor device supported by and located at least partially within the first surface of the first substrate;
   a first electrically conductive layer coupled to the first surface of the first substrate, the first electrically conductive layer electrically coupled to the semiconductor device;
   a second electrically conductive layer coupled to a first portion of the second surface of the first substrate, the second electrically conductive layer electrically coupled to the first electrically conductive layer; and
   a third electrically conductive layer coupled to a second portion of the second surface of the first substrate, the third electrically conductive layer devoid of a d.c. connection with the first and second electrically conductive layers, the third electrically conductive layer having a hole wherein the second electrically conductive layer is located in the hole.

8. The semiconductor component of claim 7 further comprising:
   a second substrate having a first surface, a second surface, and a side surface wherein the side surface of the second substrate couples the first and second surfaces of the second substrate;
   a fourth electrically conductive layer coupled to a portion of the first surface of the second substrate, the second electrically conductive layer overlying a portion of the fourth electrically conductive layer, the fourth electrically conductive layer devoid of a d.c. connection with the first, second, and third electrically conductive layers;
   a fifth electrically conductive layer coupled to a different portion of the first surface of the second substrate, the fifth electrically conductive layer devoid of a d.c. connection with the first, second, and fourth electrically conductive layers, the fifth electrically conductive layer underlying a portion of the third electrically conductive layer;
   a sixth electrically conductive layer coupled to the second surface of the second substrate, the sixth electrically conductive layer electrically coupled to the fifth electrically conductive layer, the sixth electrically conductive layer devoid of a d.c. connection with the first, second, and fourth electrically conductive layers; and
   an electrically insulating layer between the second and fourth electrically conductive layers and between the third and fifth electrically conductive layers and between the first and second substrates, the second and fourth electrically conductive layers capable of being electrically coupled together by a high frequency current through the electrically insulating layer, the third and fifth electrically conductive layers capable of being electrically coupled together by another high frequency current through the electrically insulating layer.

9. The semiconductor component of claim 8 wherein the electrically insulating layer is devoid of a via.

10. The semiconductor component of claim 7 wherein the first substrate has a via and wherein the first and second electrically conductive layers are electrically coupled together through the via.

11. The semiconductor component of claims 7 further comprising a fourth electrically conductive layer coupled to the side surface of the first substrate wherein the fourth electrically conductive layer electrically couples the first electrically conductive layer to the second electrically conductive layer.

12. A semiconductor component comprising:
   a semiconductor substrate having a first surface and a second surface wherein the first and second surfaces are opposite each other;
   a semiconductor device in the first surface of the semiconductor substrate;
   a first metal layer electrically coupled to the semiconductor device, the first metal layer adjacent to the first surface of the semiconductor substrate;
   an additional substrate having a first surface and a second surface, the first surface of the additional substrate facing towards the second surface of the semiconductor substrate, the additional substrate comprised of an other semiconductor substrate wherein the first and second surfaces of the additional substrate are at opposite sides of the other semiconductor substrate;
   a second metal layer adjacent to the first surface of the additional substrate, the second metal layer under the second surface of the semiconductor substrate, the second metal layer under a portion of the first metal layer;
   a third metal layer adjacent to the second surface of the semiconductor substrate, the third metal layer devoid of a d.c. connection with the first and second metal layers, the third metal layer having a hole under the first metal layer to permit electrical coupling between the first and second metal layers;
   a dielectric layer located between the second metal layer and the third metal layer and between the first surface of the additional substrate and the second surface of the semiconductor substrate, the second metal layer electrically coupled to the first metal layer through the semiconductor substrate and through the dielectric layer, the first and second metal layers;

a fourth metal layer adjacent to the second metal layer and the first surface of the additional substrate, the fourth metal layer devoid of a d.c. connection with the first and second metal layers wherein the dielectric layer is between the third and fourth metal layers and wherein the fourth metal layer is electrically coupled to the third metal layer by a high frequency signal through the dielectric layer.

13. The semiconductor component of claim 12 further comprising a fifth metal layer adjacent to the third metal layer and the second surface of the semiconductor substrate, the fifth metal layer overlying a portion of the second metal layer, a portion of the fifth metal layer in the hole of the third metal layer, the fifth metal layer devoid of a d.c. connection with the second, third, and fourth metal layers, the fifth metal layer electrically coupled to the first metal layer wherein a portion of the dielectric layer is located between the second and fifth metal layers wherein the fifth metal layer is electrically coupled to the second metal layer through the portion of the dielectric layer by a high frequency signal and wherein the portion of the dielectric layer is continuous.

14. The semiconductor component of claim 13 wherein the semiconductor substrate has a via extending from the first surface of the semiconductor substrate to the second surface of the semiconductor substrate and wherein the fifth metal layer is electrically coupled to the first metal layer through the via.

15. The semiconductor component of claim 12 wherein the fourth metal layer has a length and a width wherein the length is approximately equal to the width.

16. The semiconductor component of claim 12 further comprising a fifth metal layer adjacent to the second surface of the additional substrate, the fifth metal layer electrically coupled to the fourth metal layer.

17. The semiconductor component of claim 12 wherein the fourth metal layer has a length of approximately one quarter of a wavelength of an operating frequency of the semiconductor device and wherein the hole in the third metal layer has a length of approximately one quarter of a wavelength of an operating frequency of the semiconductor device.

18. The semiconductor component of claim 13 wherein the fourth metal layer has a length and a width of approximately one quarter of a wavelength of an operating frequency of the semiconductor device and wherein the fifth metal layer has a length of approximately equal to the length of the fourth metal layer.

* * * * *

UNITED STATES PATENT AND TRADEMARK OFFICE
CERTIFICATE OF CORRECTION

PATENT NO.    : 5,773,887
DATED         : June 30, 1998
INVENTOR(S)   : Anthony M. Pavio et al.

It is certified that error appears in the above-identified patent and that said Letters Patent is hereby corrected as shown below:

Column 9,
Line 3, delete ";" and add -- devoid of a d.c. connection with each other; and --.

Signed and Sealed this

Fourteenth Day of May, 2002

*Attest:*

JAMES E. ROGAN
*Director of the United States Patent and Trademark Office*

*Attesting Officer*